United States Patent [19]

Lacombat

[11] 4,402,610

[45] Sep. 6, 1983

[54] OPTICAL SYSTEM FOR THE AUTOMATIC ALIGNMENT OF TWO MOTIFS COMPRISING ALIGNMENT MARKS OF THE GRATING TYPE, PARTICULARLY IN DIRECT PHOTOREPETITION ON SILICON

[75] Inventor: Michel Lacombat, Paris, France

[73] Assignee: Thomson-CSF, Paris, France

[21] Appl. No.: 212,585

[22] Filed: Dec. 3, 1980

[30] Foreign Application Priority Data

Dec. 18, 1979 [FR] France .................. 79 30936

[51] Int. Cl.³ .................................. G01B 11/27
[52] U.S. Cl. .................................. 356/400; 356/355; 356/363
[58] Field of Search .................. 356/399–401, 356/363, 356, 358, 375, 355; 250/561

[56] References Cited

U.S. PATENT DOCUMENTS

| | | | |
|---|---|---|---|
| 3,541,338 | 11/1970 | Duda et al. | 356/400 |
| 3,861,798 | 1/1975 | Kobayashi et al. | 356/363 |
| 4,153,371 | 5/1979 | Koizumi et al. | 356/400 |
| 4,172,664 | 10/1979 | Charsky et al. | 356/363 |
| 4,200,395 | 4/1980 | Smith et al. | 356/400 |

OTHER PUBLICATIONS

G. Bouwhuis et al.: "Automatic Alignment System for Optical Projection Printing," pp. 723 to 728, IEEE Transactions on Electronic Devices, vol. ED-26, No. 4, 1979 New York (US).

*Primary Examiner*—William H. Punter
*Attorney, Agent, or Firm*—Oblon, Fisher, Spivak, McClelland & Maier

[57] ABSTRACT

Optical system for the automatic alignment of two motifs in which the alignment marks of a first fixed motif forming the reference are constituted by at least one pair of identical periodic optical gratings with a constant spacing P and having a predetermined distance $d_X$ from one another such that the equation $d_X = (n + \epsilon) P$ is proved, n being an integer and $\epsilon$ a fraction of unity.

An optical modulator, for example electro-optical means incorporating a Pockels cell alternately illuminate with the timing of the high frequency control signals, the said gratings in windows, whose position can be regulated in accordance with a given axis. The image of these windows is projected onto gratings carried on a second moving support to be aligned and produces orders of diffraction. An optoelectronic detector detects a predetermined order of diffraction. The high frequency-modulated output signals are transmitted to control circuits for producing the automatic alignment.

14 Claims, 16 Drawing Figures

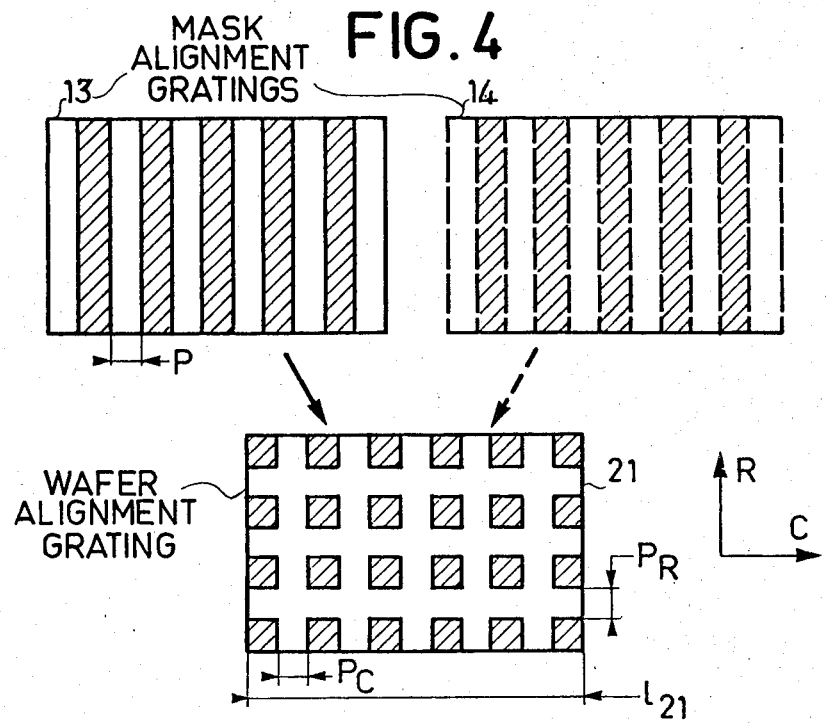
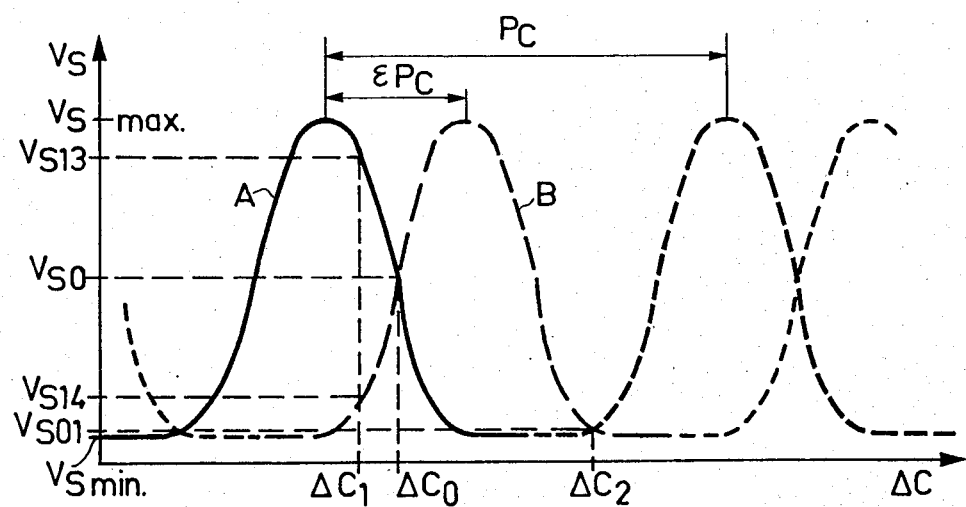

OPTICAL SYSTEM FOR THE AUTOMATIC ALIGNMENT OF TWO MOTIFS COMPRISING ALIGNMENT MARKS OF THE GRATING TYPE, PARTICULARLY IN DIRECT PHOTOREPETITION ON SILICON

BACKGROUND OF THE INVENTION

The invention relates to an optical system permitting the automatic alignment of two motifs comprising alignment marks in the form of optical gratings. The invention more particularly applies to direct photorepetition on silicon.

The manufacture of integrated circuits involves the formation of windows on a substrate making it possible to locate the implantation or treatment. This subtrate is covered with a layer of photosensitive resin. The windows are formed by masking this resin from a mask carried by a reticule. Previously, the proximity of direct contact transfer method was used for this purpose. The processes which are used at present involve transfer by optical projection.

This projection can be carried out in a one-to-one ratio, the mask then being completely projected onto the wafer. This projection can also be carried out by image resolution either by the analysis of the mask by a moving slot or by using photorepetition in a ratio 1:n.

When producing the circuits by direct photorepetition, each motif to be formed is directly projected onto the semiconducting wafer previously covered with a photosensitive resin layer in accordance with a preferred predetermined program, the wafer position being controlled by interferometry in two directions X and Y. Conventionally, photorepetition is carried out by displacing the wafer in two orthogonal directions X and Y.

In all cases, very precise reciprocal positioning of the recticule and the semiconducting material wafer on which the integrated circuit is to be formed is necessary. To this end, numerous alignment processes have been proposed. Generally, supplementary motifs incorporating alignment marks have been used and they are respectively carried by the reticule and the semiconducting wafer. In this process, the number of the marks, their arrangement or their configuration must be such that they permit the alignment in accordance with two reference axes X, Y and the angular alignment of the semiconducting wafer.

One of the most widely used methods consists of superimposing alignment marks on the mask and on the semiconducting wafer by means of transfer optics and observing this superimposition with a microscope having two lenses of the split-field type. The eye of the operator is advantageously replaced by a vidicon tube for display on a television screen.

According to a more elaborate process, the video signal obtained by the television camera can be processed so as to obtain an analog or digital signal which can be used by control circuits. Certain processes use, for example, the scanning of a St. Andrew's cross and its complement to determine the alignment variation which causes a gap between the fronts of the signals.

The apparatus realising these prior art processes have two major disadvantages. The field of the alignment marks carried by the mask and the semiconducting wafer is completely illuminated and onto the images of said marks is superimposed a by no means negligible noise level (parasitic reflection, diffusion, diffraction) leading to a poor signal-to-noise ratio. In addition, the contrast of the silicon marks varies very widely from one integration level to the next, bearing in mind the variations in the oxide thickness or the nature of the deposits (polycrystalline silicon, aluminum). Thus, the alignment quality differs. It is dependent on the contrast on the one hand and on either the keyness of sight of the operator or the resolving power of the associated electronics on the other.

To obviate these disadvantages, it has been proposed to use as the alignment mark, optical networks or fields having a constant or variable spacing, for example in accordance with a pseudo-random code such as codes of the Barker type. Such a process is more particularly described in the European patent application filed in the name of the applicant company and published under No. EP-Al-0015 173 on Sept. 3, 1980 and filed in the United States as application Ser. No. 124,077.

According to the process described in this patent application, a first motif constituted by two optical gratings positioned along two coordinate axes (X, Y) is illuminated by the image of a second motif comprising two optical gratings forming a reference and produces orders of diffraction. According to one of the variants of this application the optical gratings are constituted by a sequence of parallel lines, whose thickness and spatial distribution in a first direction (C) are determined by a pseudo-random code. The lines of the optical gratings of the first motif are also periodically interrupted in a second direction (R) to form an optical grating with a constant spacing. The optical alignment system has optoelectronic means for detecting the intensity of a predetermined part of the orders of diffraction in direction (R).

It is also known that the alignment can be obtained "directly," i.e. through projecting the image of gratings carried by the reticule onto gratings carried by the semiconducting wafer or "sequentially" by using an intermediate alignment motif linked with the photorepeater chassis. Such a process is also described in the aforementioned patent application.

It is also known that for obtaining an automatic alignment it is necessary to create electrical signals which can be used by electronic control circuits associated with the photorepeater. These circuits conventionally act on means for driving or moving the table carrying the semiconducting wafer. Among these signals, it is known to use a bipolar signal in the form of an elongated S passing through zero when alignment is obtained. To obtain this result, it is necessary to modulate the output signals of the optoelectronic detection means.

In the prior art, the means used for obtaining this modulation are generally mechanical. As non-limitative examples, reference is made to the angular modulation of the reflection angle of the light beams used for the alignment by an oscillating mirror, the passage of this beam through an optical plate which also performs an oscillating movement or linearly vibrating about a point of rest of the semiconducting wafer. The latter effect can be obtained by means of piezoelectric motors generally used to equip the X, Y translation table carrying the semiconducting wafer.

These processes have a certain number of disadvantages including the inertia inherent in any mechanical system, the difficulty of obtaining a stable zero (clearly defined point of rest) or in the case of certain of these processes the appearance of optical abberations due to the introduction of optical means onto the path of the light beams used for the alignment and traversed by said beams.

BRIEF SUMMARY OF THE INVENTION

To obviate these disadvantages, the present invention relates to a system for the optical alignment of at least a first motif carried by a moving support with respect to a second motif carried by a fixed support forming the reference, the first and second motifs comprising in each case alignment marks of the optical grating type having a constant spacing, the system also comprising optical means with a given magnification serving to project the image of gratings forming alignment marks of the second motif onto gratings forming alignment marks of the first motif, said correlation producing orders of diffraction whose light intensity detected by optoelectronic means represents the alignment state reached, wherein the alignment marks of the first motif comprise at least first and second identical optical gratings, each constituted by a sequence of lines parallel to a first axis of symmetry and located on either side of said axis, the two identical gratings being spaced from one another by a predetermined length and wherein two windows define two portions, respectively of the first and second optical gratings, optical means comprising a light energy source producing an alignment beam and a selective switch receiving a control signal of given frequency for alternatively illuminating at said frequency in each case one of the windows, the output signal of the optoelectronic means also being generally transmitted to electronic comparison means establishing their level difference between alternations of the control signal.

BRIEF DESCRIPTION OF THE DRAWINGS

The invention is described in greater detail hereinafter relative to non-limitative embodiments and with reference to the attached drawings, wherein show:

FIGS. 2 to 4 details or special features of the system according to the invention.

FIGS. 5 to 7 diagrams illustrating the operation of the system according to the invention.

DETAILED DESCRIPTION OF THE PREFERRED EMBODIMENTS

A brief description will firstly be given of the process making it possible to reciprocally align two motifs, in each case constituted by a pair of optical gratings. This process is, for example, described in the aforementioned European patent application. For reference purposes, it is also assumed without in any way limiting the scope of the invention, that the alignment is obtained "sequentially" by using one or more intermediate motifs linked with the chassis of a photorepeater.

In this case, the reticle, which, in addition with a motif to be projected or transferred onto to semiconducting wafer, carries a motif comprising at least one pair of alignment marks is positioned in precise manner relative to a fixed intermediate motif comprising, for example, a first pair of optically complementary marks. This intermediate motif has a second pair of alignment marks used in a subsequent phase for precisely positioning the semiconducting wafer relative to said intermediate motif.

It is also assumed that the first alignment phase is carried out in conventional manner and that only the second pair of alignment marks and the marks carried by the semiconducting wafer are of the optical grating type. The invention will therefore be described within the scope of said second alignment phase of the two motifs.

Figure 1:
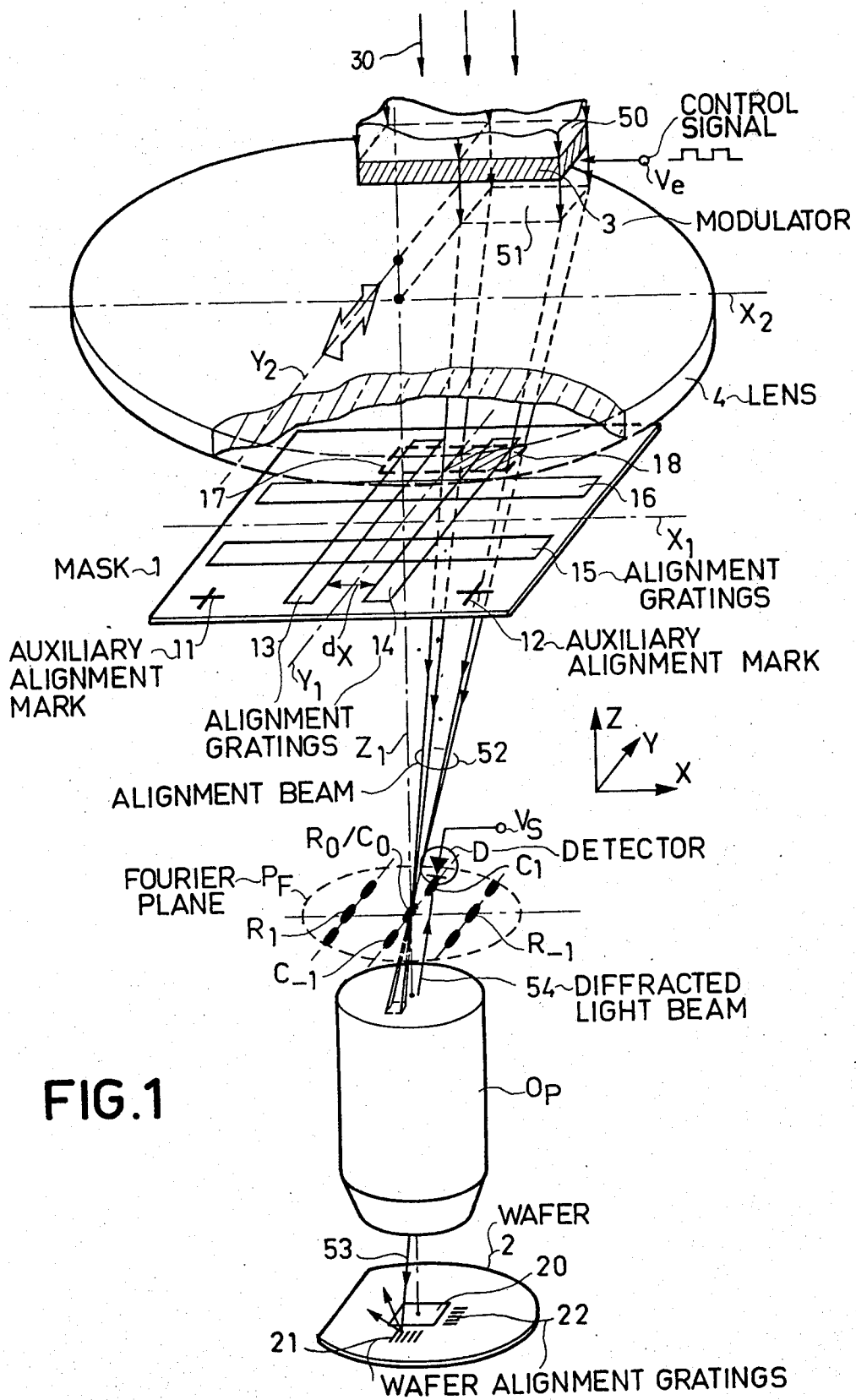
FIG. 1 diagrammatically, an optical alignment system according to the invention.
Figure 2:
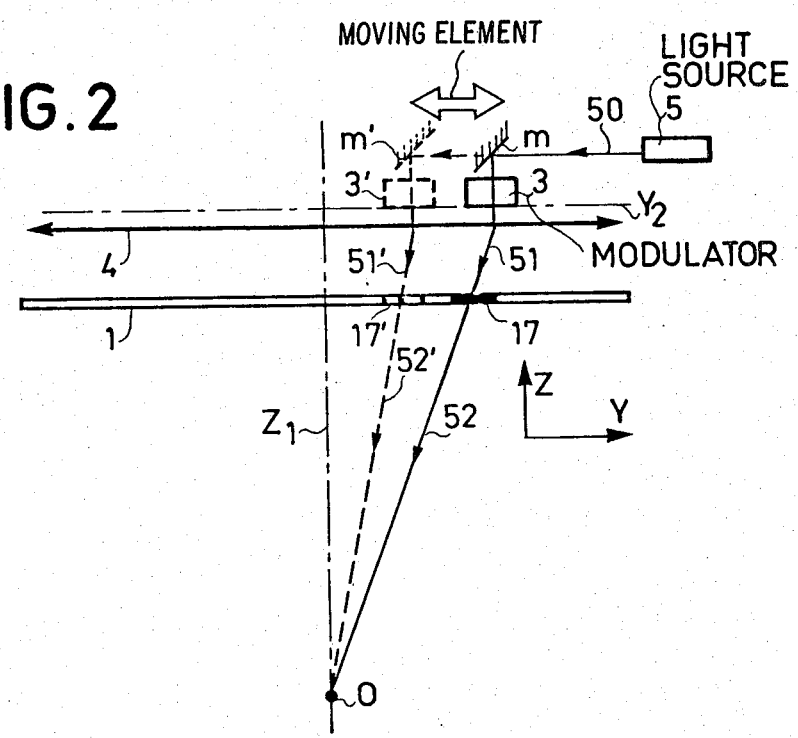

FIGS. 1 to 4 illustrate an embodiment of an optical alignment system according to the invention. A silicon wafer 2 onto which are to be projected at 20 motifs carried by a not shown reticule must be aligned with respect to an intermediate motif carried by support 1 connected to the photorepeater chassis. To this end, support 1 and wafer 2 carry gratings 13, 14 and 15, 16, respectively 21, 22 which are used for aligning wafer 2 and support 1. Support 1 and wafer 2 are located in planes perpendicular to the optical axis $Z_1$ of a projection lens $O_p$. The marks used for alignment are optical gratings constituted by parallel lines having two preferred axes X, Y which are orthogonal to one another. Marks 13, 14 and 15, 16 are gratings. Marks 21, 22 are also gratings of the same type as for support 1. In addition, the lines forming the grating are interrupted in a regular manner in a second direction R (orthogonal to the first direction C) and consequently form a grating with a regular spacing in said direction. In FIG. 1, only the alignment of the gratings has been illustrated in accordance with axis X, the alignment according to axis Y being identical.

Within the scope of the invention, the gratings which can be used have a constant spacing in direction C. Such gratings are more particularly illustrated in FIGS. 3 and 4. According to one of the most important features of the invention, the gratings carried by support 1 are in fact constituted by pairs of identical gratings, respectively 13, 14 and 15, 16. These gratings are arranged parallel to two axes of symmetry $X_1$ and $Y_1$ and on either side and equidistant with respect to these axes as shown in FIG. 1. In turn, axes $X_1$ and $Y_1$ are respectively parallel to axes X and Y.

Moreover, according to a second feature of the invention, only the windows 17, 18 defined on the said gratings are illuminated in alternating manner. As a result, the images of these windows 17 or 18 are successively projected onto the corresponding grating 21 carried by the semiconducting wafer 2. This projection is carried out by means of the projection lens, which is also used for transferring the motifs to be inscribed in area 20 of semiconducting wafer 2. The grating 21, which is partly illuminated by the image of the gratings 13, 14 will produce orders of diffraction in two preferred directions, i.e. in accordance with directions C and R or, and this amounts to the same thing, in directions X and Y. The orders of diffraction can be detected in the Fourier plane $P_F$. In the Fourier plane $P_F$ are shown the orders of diffraction $C_0$, $C_1$, $C_{-1}$ and in the other direction $R_0$, $R_1$, $R_{-1}$. The order of diffraction $R_1$ is detected by optoelectronic means D. The output signals $V_S$ of said optoelectronic detector means are transmitted to optoelectronic means which will be described hereinafter with reference to FIG. 8. It is also possible to detect the order $R_{-1}$ or any other order R±n differing from order $R_o$ which coincides with order $C_o$. Grating 22 for the alignment of path Y diffracts in directions orthogonal to the diffraction directions of grating 21. Order $R_1$ or $R_{-1}$ or any other order R±n of grating 22 can be detected on axis X. This method makes it possible to spatially discriminate the alignment signals X and Y if the spacings of the gratings differ in directions R and C. If not, the discrimination can, for example, be obtained by using two orthogonal polarizations of the light for gratings X and Y. The detectors of paths X and Y are then equipped with analysers making it possible to select only the light corresponding to the observed direction.

In general, the Fourier plane $P_F$ coincides with the image of the entrance pupil of the projection lens $O_p$.

The phenomenon described hereinbefore occurs no matter what image of gratings 13 or 14 (defined by windows 17 or 18) is projected onto grating 21. The output signals in voltage $V_S$ supplied by the optoelectronic means D are represented in the diagram of FIG. 5 as a function of the relative positions of the image of grating 13 (window 17) and grating 21: curve A in continuous line form, or the image of grating 14 (window 18) and grating 21: curve B in dotted lines. The axis $\Delta C$ represents the misalignment in direction C.

It is naturally necessary to take account of the magnification G of lens $O_p$, which is generally of the order of 1/5 to 1/10 (in absolute values) for determining the spacing $P_C$. It is necessary to check the equation:

$$P_C = |G| \cdot P \tag{1}$$

P being the spacing of gratings 13 and 14.

Moreover, if $d_X$ is the distance separating the two gratings 13 and 14 and $l_{13}$ and $l_{14}$ their respective widths equal to a common value l, the width $l_{21}$ of grating 21 in direction C must be such that the following equation is proved:

$$l_{21} \geqq |G| \cdot (2l + d_X) \tag{2}$$

The spacing is equal to $P_R$ in direction R.
Furthermore, $d_X$ is given by the equation $$d_X = P(n + \epsilon) \tag{3}$$

in which P is the spacing of gratings 13 and 14, n being an integer and $\epsilon$ fraction of unity (e.g. 0.25).

On returning to FIG. 5 representing the signal detected by D in order $R_1$ (Or $R_{-1}$) it can be seen that the curves A and B representing the signals are periodic and cyclic, non-sinusoidal and displaced with respect to one another by $\epsilon \cdot P_C$. On assuming another order R±n with n differing from 1 or 0, the response curves become sinusoidal. The successive maxima of curves A and B correspond to the spatial correlation of one of the images of gratings 13 or 14 with grating 21. It will subsequently be shown how it is possible to remove the uncertainty due to the periodicity of the gratings in connection with FIGS. 10 and 16. On alternately illuminating gratings 13 and 14 for a random position of the semi-conducting wafer with respect to the image of gratings 13 and 14 corresponding to a value of $\Delta C$, i.e. $\Delta C_1$, the output voltage of the optoelectronic means D varies in alternating manner for value $V_{S13}$ to value $V_{S14}$. These values differ except for a specific position $\Delta C_0$ corresponding to alignment. There is no further variation to the output voltage which is equal to $V_{S0}$.

One of the windows 17 or 18 must be alternately illuminated to obtain the result defined hereinbefore. To this end, an optical modulator, e.g. an electrooptical element such as a Pockels cell is placed between the support 1 (which can be light-opaque outside the areas containing gratings 13, 14, 15 and 16 and transparent between the opaque lines constituting these gratings.) As stated hereinbefore these lines are equidistant with the spacing P.

The entire surface area of the POCKELS cell 3 is illuminated by light beams 30 of rectangular cross-section in FIG. 1. In actual fact, the cross-section of beam 30 can be of a random nature, provided that all the upper surface area of cell 3 is illuminated. In this case, an opaque screen can be placed all round the cell to intercept excess light beams.

The cell, which will be described in greater detail relative to FIG. 9, behaves like two half-cells alternately permitting the passage of half the instant beam under the control of an electrical signal $V_e$ in the form of a square-wave signal of high frequency f and, according to a preferred embodiment, of cyclic ratio equal to 1.

As a result, the windows 17 and 18 are alternately illuminated with the timing of the variation of signals $V_e$, the half-cells blocking off with the same timing that part of beam 50 which passes through them. In FIG. 1, window 18 is illuminated by the a half-beam 51 and that part of grating 14 defined by window 18 is projected onto grating 21. The path of the rays is indicated by references 52 and 53. FIG. 1 only shows a single direction of the diffracted rays 54.

Figure 6:
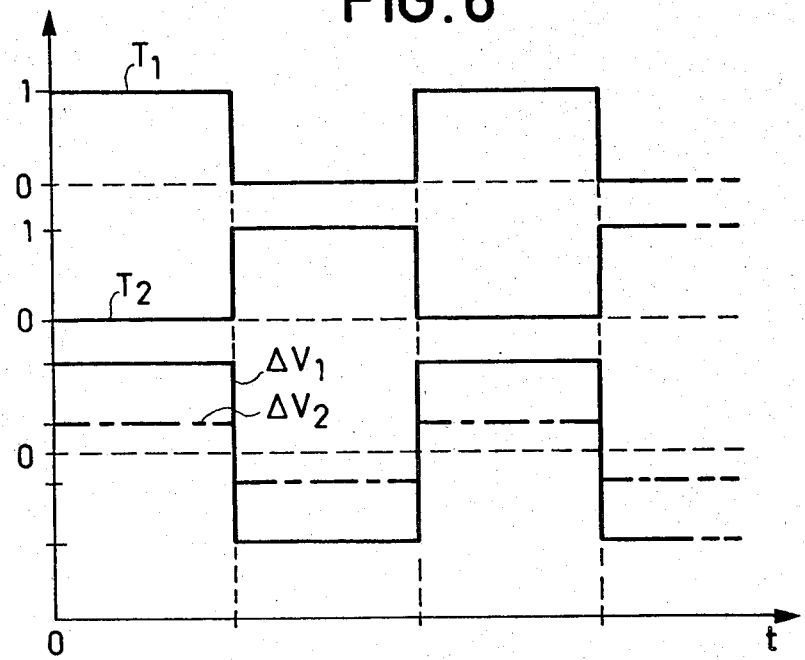

FIG. 6 illustrates by means of curves $T_1$ and $T_2$ the transmission coefficient of two parts of the cell 3 as a function of time. These coefficients substantially vary between values zero (no light transmitted) and 1 (all the light transmitted), the functions represented by curves $T_1$ and $T_2$ being in phase opposition. The signal detected by received D has an alternating amplitude $\Delta V = V_{S13} - V_{S14}$, which is cancelled when alignment is reached. The lower part of FIG. 6 illustrates two values of $\Delta V$ one $\Delta V_1$ far from alignment and the other $\Delta V_2$ close to alignment.

The maximum amplitude of V is given by the equation:

$$V_{max} = V_{Smax} - V_{Smin} \tag{5}$$

Furthermore, $\Delta V = 0$ on obtaining an alignment or when the edges of gratings 13 and 14 are projected outside the useful area of grating 21. A simple logic circuit both combined with devices utilizing approximately processes to be described hereinafter make it possible to reject the latter case.

Thus, this case corresponds to the abscissa $\Delta C_2$ for example on the diagram of FIG. 5. For this abscissa $V_S = V_{S01} \approx V_{Smin}$. It is then merely necessary to use a threshold circuit which detects a value of $V_S$ exceeding a predetermined threshold $V_R$. The logic circuit detects the appearance of $V_S \geqq V_R$. A simple logic circuit is able to supply at the output a binary authorization signal for opening the control circuit solely between two values $\Delta C_{R1}$ and $\Delta C_{R2}$ which will be described in FIG. 7.

Figure 7:
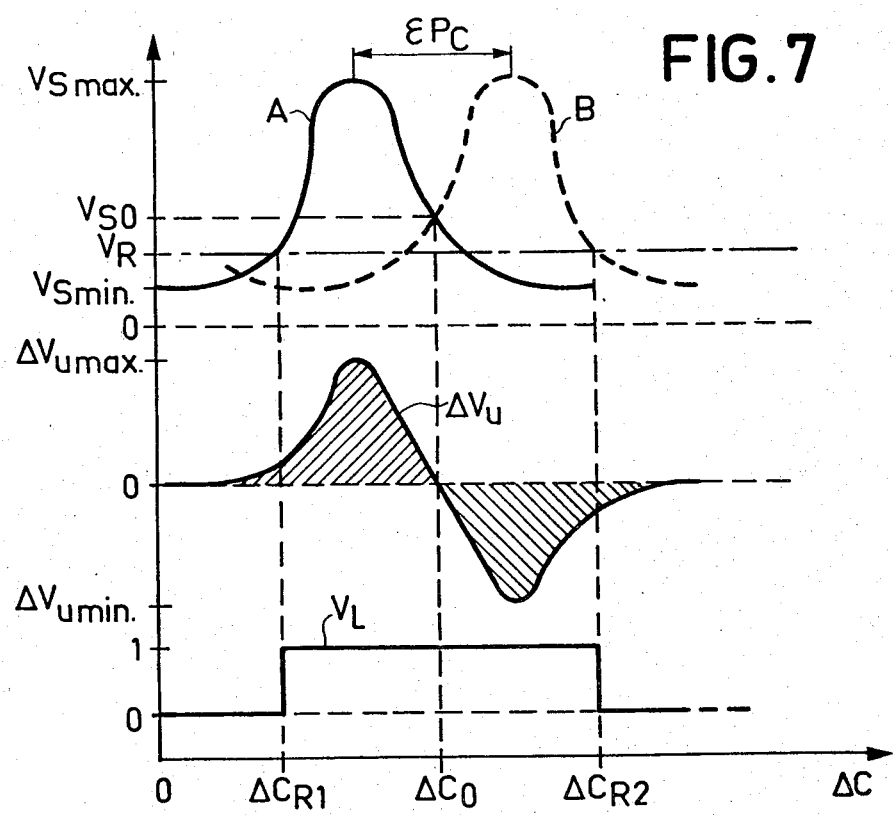

On drawing curve $\Delta V$, no longer as a function of the time for a fixed abscissa, but as a function of the misalignment $\Delta C$ a curve $\Delta Vu$ of the median part of the diagram of FIG. 7 is obtained in the form of an S. The upper part of the diagram contains the curves A and B described hereinbefore and a value $V_R$ representing the threshold value of $V_S$ above which the device is not authorized to operate, i.e. outside an interval $\Delta C_{R1} - \Delta C_{R2}$ of the curve representing the signal supplied by the aforementioned logic circuit, said curve $V_L$ being in the lower part of the diagram. By convention, the logic value 1 indicates the active state of the device. Curve $\Delta Vu$ has the following characteristics:

symmetry with respect to the pair of coordinates: o, $\Delta C_0$ the absolute value of the maxima and minima is only dependent on the value $V_{Smax} - V_{Smin}$ the slope of the curve in the central area is only dependent on the current value $\epsilon P_C$ and can therefore be determined a priori, this portion of the curve being very close to a straight line for each abscissa point $\Delta C$ the signal $\Delta Vu$ is a square-wave signal varying with the timing of the signals of frequency f.

It should be noted that the latter characteristic permits a simple selection of the signals for the alignment path following the reference axis X and those for path Y. For this purpose, it is merely necessary to use two separate frequencies, $f_X$ for path X and $f_Y$ for path Y, whilst using selective filters for discriminating signals X and Y.

The modulated signals which vary in amplitude and sign, i.e. in phase in accordance with curve $\Delta Vu$ can be directly used by controlled circuits. The absolute value of $\Delta Vu$ represents the amplitude of the misalignment $\Delta C$ and the sign the direction of this misalignment.

Figure 8:
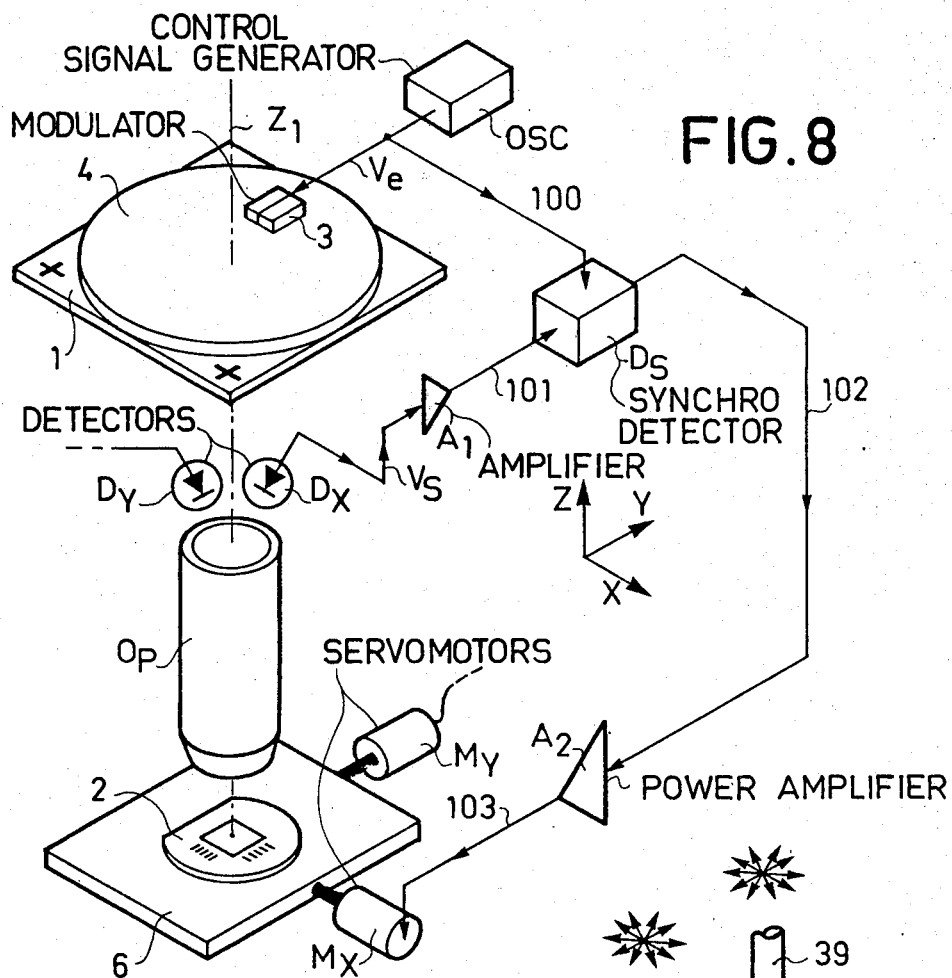
FIG. 8 diagrammatically, the electronic circuits of the control loop used in the system according to the invention.

An example of a control circuit is illustrated by FIG. 8. The semiconducting wafer is integral with a table X, Y driven in per se known manner by two servomotors $M_X$, $M_Y$ in two directions parallel to the reference axes X, Y. Path X only will be described, path Y being identical. This drawing shows the main elements described with reference to FIG. 1 and which will not be described again. The output $V_S$ of the optoelectronic detector $D_X$ is transmitted to the output of a selective amplifier $A_1$. A second detector $D_Y$ is provided for path Y. Selective amplifier $A_1$ is tuned to a frequency $f_X$ equal to the frequency of the control signals produced by a square-wave signal generator OSC. These signals are transmitted on the one hand to the control input $V_e$ of the cell 3 and by connection 100 to a synchronous detector $D_S$ receiving the output signals from amplifier $A_1$ at a second input via connection 101. The function of the synchronous detector is to process signal $\Delta Vu$ from the diagram of FIG. 7 and to produce signals transmitted by connection 102 to a power amplifier controlling by 103 the table drive motor $M_X$. For this purpose, the signals $V_S$ are cyclically compared with the control signal $V_e$. The polarity of the thus processed signals must be the same as the polarity of signals $\Delta Vu$ in such a way that the alignment variation is reduced because the value $\Delta Vu = 0$ is detected. The electronic components required for producing the control circuits as described relative to FIG. 8 are well known to the Expert and do not require a more detailed description.

Figure 9:
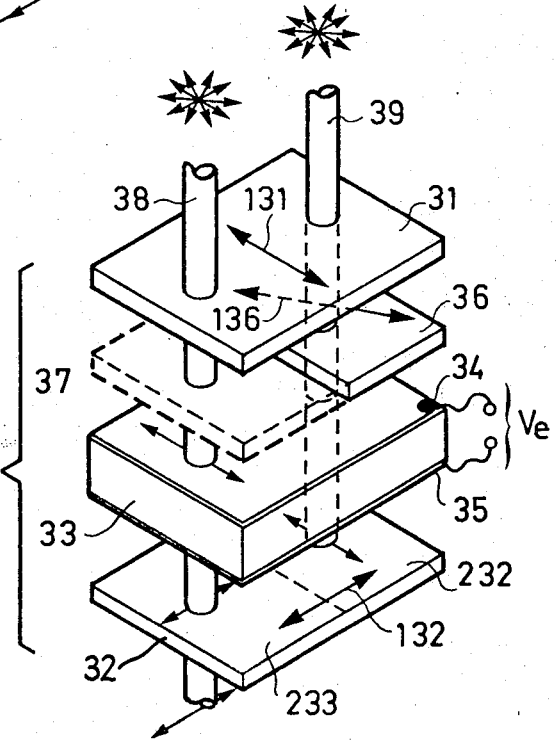
FIG. 9 an optoelectronic cell of the Pockels cell type used by the invention.

The optoelectronic Pockels cell used for selectively obtaining the alignment light beam is illustrated in greater detail by FIG. 9. Its active element is constituted by a plate 33 of crystalline material having linear optoelectronic effects (Pockels effect). This plate provided with two electrodes 34, 35 traversed by polarized light beams and transparent to said beams, rotates the polarization of these beams by $\pi/2$ in accordance with the voltage $V_e$ applied to the terminals of the electrodes. According to the invention, the applied voltage $V_e$ supplied by the generator OSC (FIG. 8) is in the form of high frequency square-wave signals. As a non-limitative example, the frequency can be in the range 100 KHz to 1 MHz. The material used can be KDP. Linear optoelectronic effects are also exhibited by other materials (e.g. ADP, lithium niobate, sodium barium neobate, etc). These materials must be transparent or have a limited absorption for the wavelength of the light used. The electrical optical crystal 33 is preceded by a polarizer 31 if the light has not already been polarized and is followed by an analyser 32. In addition, a half-wave plate 36 is positioned on half the surface of the electro-optical crystal 33, thus defining a half-cell. The neutral axis 136 of this plate forms an angle of $\pi/4$ with the crossed polarization axes 131, 132 of polarizer 31 and analyser 32 respectively. For reference, it is assumed that the polarization axis 131 is parallel to the reference axis Y. To illustrate operation, FIG. 9 shows two narrow beams of unpolarized light, each traversing one of the thus defined half-cells. Only beam 38 emerges from analyser 32 with a polarization parallel to axis Y, the voltage $V_3$ being such that the optoelectronic crystal 33 rotates the polarization axis of the emergent beam of the half-wave plate 36. The latter has in turn turned the polarization by $\pi/2(s \times \pi/4)$. In reality, and as has been shown hereinbefore, the narrow beams 38 and 39 are combined into a single beam of adequate cross-section to entirely cover the surface of the cell. It follows that only a half-beam emerges at the rhythm of the variations of signal $V_e$ applied to the terminals of electrodes 34 and 35 alternately at 232 and 233 and consequently illuminating one or other of the windows 17 and 18 (FIG. 1). In order not to impair the symmetry of cell 3, an either neutral or half-wave plate whose neutral axis is parallel to the polarization axis of polarizer 31 can be introduced at 37. Thus, the optical paths of the two half-cells are then equal.

In the embodiment illustrated in FIG. 9, the transverse effect is used making it necessary for the electrodes 34 and 35 to be transparent. It is also possible to use the longitudinal effect. Finally, whilst utilizing the Pockels effect, it is possible to replace the thus described cell by a deflection switching the incident beam two emergent beam areas.

It is also possible to use other electro-optical effects, such as quadratic effects of the type encountered with Kerr cells or it is possible to use liquid crystal cells of the helical nematic effect rotating the polarization under the effect of a control voltage. In the latter case, the control voltage frequency cannot reach the values permitted by the Pockels or Kerr effect. All these effects are well known and do not require a more detailed description. It is also possible to use acousto-optical cells.

On returning to FIGS. 1 and 2, according to an interesting feature of the invention, the thus formed cell is integral with a moving element moving in a direction $Y_2$ parallel to axis Y (a second not shown cell moves in a direction $X_2$ parallel to axis Y). An arrow on FIGS. 1 and 2 symbolizes the displacement. It follows that windows 17 and 18 also travel in a direction $Y_1$ parallel to axis Y. This makes it possible to adapt the alignment device of the invention to the size of the circuits present on the semiconducting wafer and in particular to the position of gratings 21 and 22 with respect to axis $Z_1$.

In order that the source used for the alignment is always imaged at the same point O, which must be located at the centre of the projection lens pupil, according to another advantageous feature of the invention a condenser 4 is inserted between cell 3 and support 1 carrying grating 13, 14 and 15, 16. This device is more particularly illustrated in FIG. 2.

Figure 3:
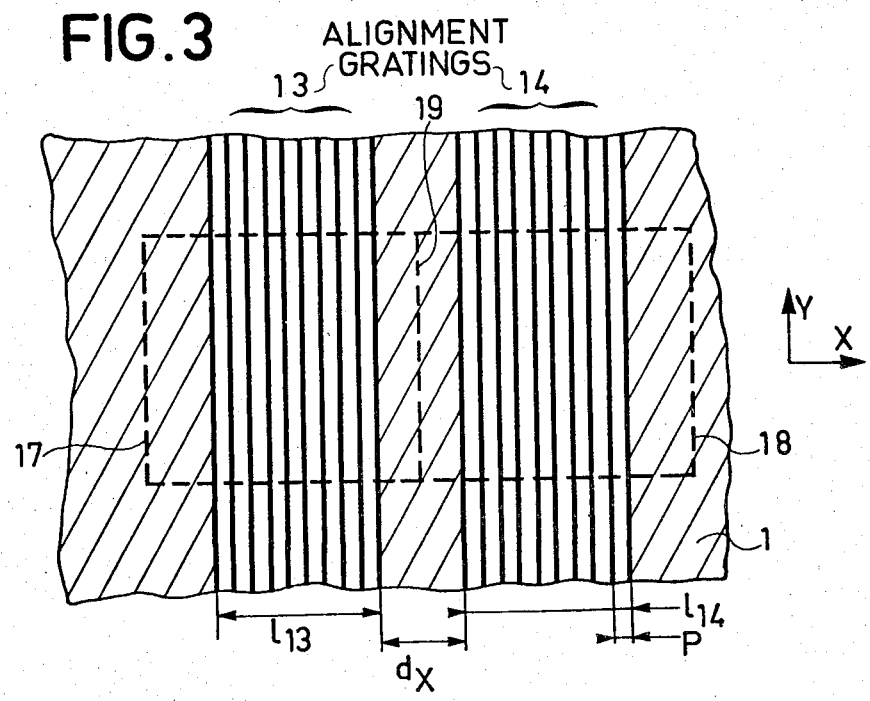

The source 5 producing the alignment beam is a radiant energy source, e.g. an He Ne laser of wavelength $\lambda = 6328$ Å. The beam is constituted by 50 rays parallel to the axis Y, which can be reflected by a mirror m to cell 3. These rays pass through cell 3 and condenser 4, emerging at 51. They are projected onto one of the windows (e.g. 17), then on emerging at 52 converge at O on axis $Z_1$, no matter what the position of cell 3. Cell 3 is shown at another position 3'. The same elements are encountered for this position: m',51',17',52'. The moving mirror m must therefore be integral with the moving element driving cell 3. The positioning in accordance with axis $Y_2$ is not critical for the alignment, because the gratings 13 and 14 extend over the entire length of support 1. With regard to the positioning along axis $X_2$, an accuracy of approximately 0.1 mm is adequate. Thus, as illustrated in FIG. 3, it is sufficient for the separating line 19 of windows 17 and 18 to be projected between the two gratings 13 and 14. The tolerance is consequently approximately the distance $d_X$ separating these two gratings. Along axis $X_1$ parallel to X the effective widths of windows 17 and 18 are defined by widths $l_{13}$ and $l_{14}$ of the gratings, which can be defined with a high level of accuracy during the processing of support 1. Moreover, in the chosen example, this support is fixed with respect to the photorepeater chassis.

As stated hereinbefore, the gratings used according to the invention are of the periodic or cyclic type. Compared with other types of gratings, e.g. gratings with variable spacings in accordance with a pseudo-random code, they have the advantage of a better response dynamics. The responses of these two types of gratings are compared in the aforementioned European patent application. In the case of a periodic network, the value $V_{Smin}$ (FIG. 5) is very low, i.e. the background noise is very low, whilst for gratings with a variable spacing in accordance with a pseudo-random code, $V_{smin}$ is approximately 20 to 50% of $V_{Smax}$. However, for periodic gratings, it is necessary to remove the uncertainty due to the periodicity by effecting an initial alignment phase, called pre-alignment hereinafter.

Figure 10:
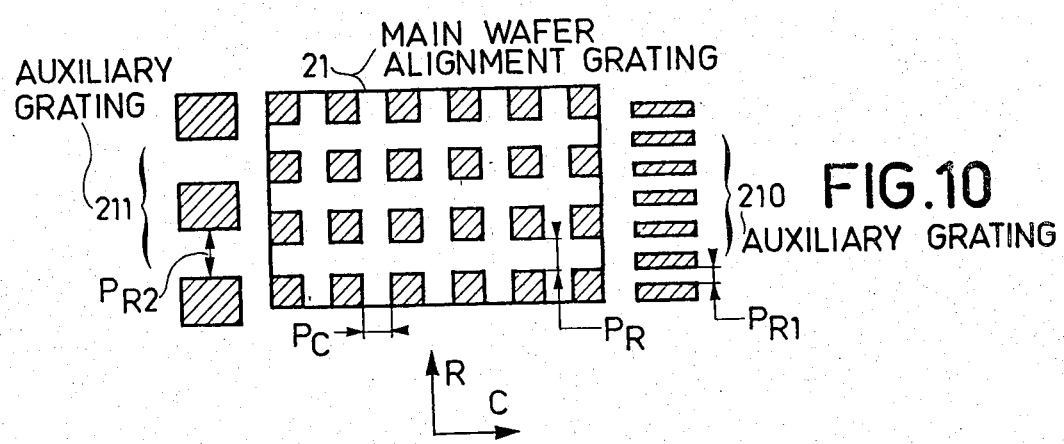
FIGS. 10 to 16 three variants of processes making it possible to obtain a prealignment.
Figure 11:
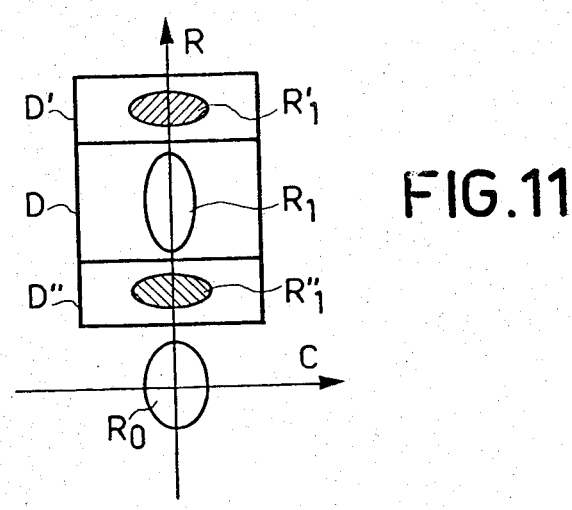

A first process, which is also described in the aforementioned patent application, is described relative to FIGS. 10 and 11. To remove the uncertainty two auxiliary gratings 210, 211 (having a constant spacing, but differing from one another: $P_{R1}$ and $P_{R2}$ and differing from the spacing $P_R$ of the main grating 20) are placed on either side of grating 21 in direction C. Out of alignment, one of these gratings also diffracts in direction R, depending on whether the images of gratings 13, 14 are projected onto grating 21 either too far to the right or too far to the left in direction C. In FIG. 11, besides the order of diffraction of the main grating $R_1$, it is possible to see the orders of gratings 210, 211: $R_1'$ and $R_1''$, the two latter orders being exclusive of one another. In the chosen example, $P_{R2} > P_R > P_{R1}$ is assumed to be satisfied by positioning three detectors D'', D and D' in direction R, alignment taking place in two phases. During the first phase or prealignment, one of the two orders $R_1'$ or $R_1''$ is detected. Thus, the direction of the non-alignment is determined and the members controlling the displacement of the wafer are actuated. During the second phase for pecision alignment, only the intensity of order $R_1$ of the main grating is measured. As hereinbefore, the order $R_{-1}$ can also be detected or any other order $R \pm_n$ differing from order $R_0$.

Figure 12:
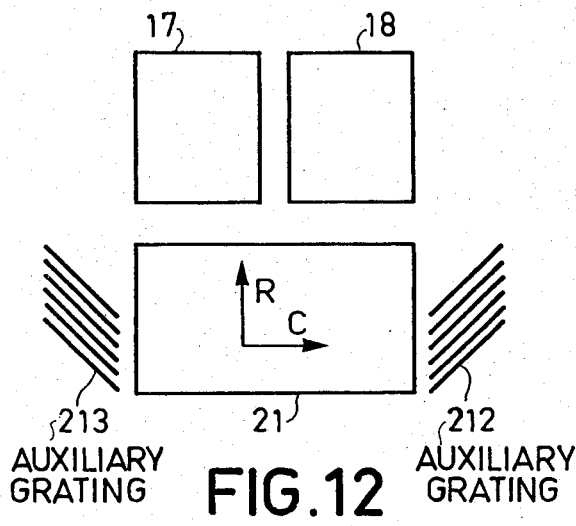
Figure 13:
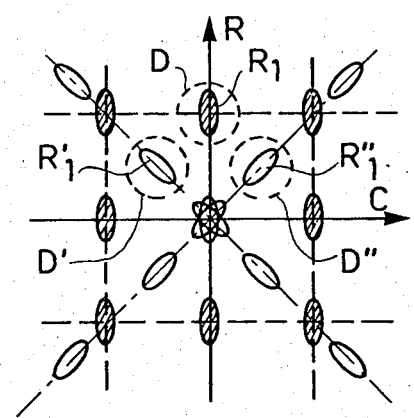

The second process is illustrated by FIGS. 12 and 13. Two auxiliary gratings 212, 213 constituted by lines forming a certain angle with direction C are provided on either side of the gratings carried by the semiconducting wafer, e.g. grating 21. In a preferred construction, this angle is $\pi/4$ for grating 212 and $3\pi/4$ for grating 213. There are consequently three different diffraction figures in the Fourier plane $P_F$ in accordance with three preferred directions forming between them the same angles $\pi/4$, $3\pi/4$ or on assuming a position with respect to direction R: $\pm\pi/4$. It is possible to detect the orders $R_1$, $R_1'$ and $R_1''$ by means of three detectors D, D' and D'', as in the first process.

Figure 16:
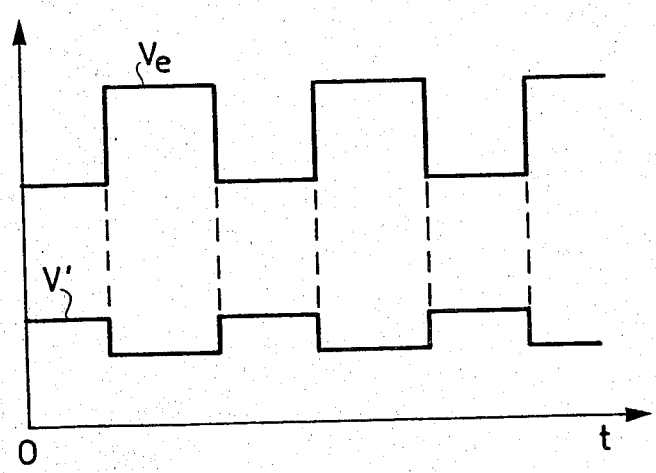
Figure 14:
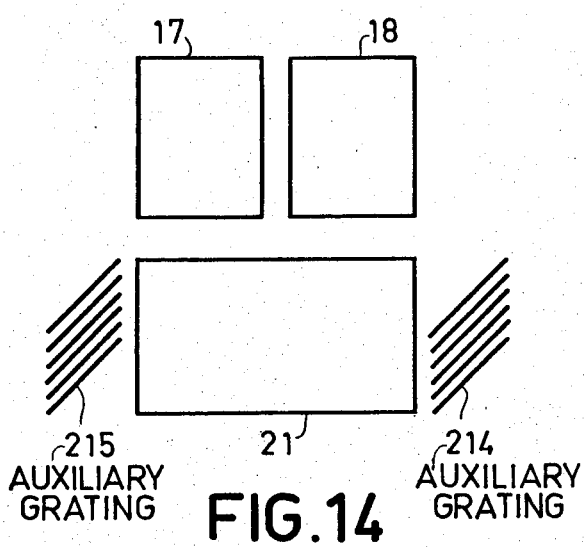
Figure 15:
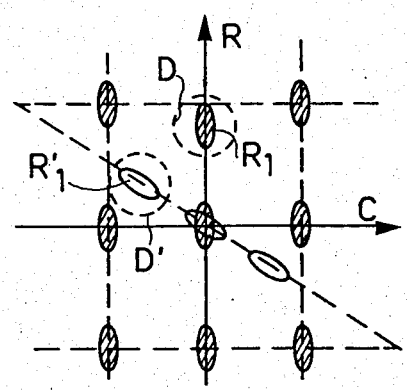

A variant of this process is illustrated by FIGS. 14 to 16. Auxiliary gratings with the same inclination (e.g. $\pm\pi/4$) are positioned on either side of grating 21. This variant only requires a single detector D', detecting for example order $R_1'$. The discrimination required for determining the misalignment direction is made possible by the detection of the phase of the output signal V' of detector D' relative to the phase of the control signal $V_e$ of the electrooptical cell 3, as illustrated in FIG. 16. $V_e$ and V' are in phase or in phase operation, as a function of the direction of the relative displacement of the image of gratings 13 and 14 on grating 21.

Although the invention has been described with specific reference to a photorepeater for the precise positioning of a reticule with respect to a semiconducting wafer, each carrying motif used for alignment in connection with a process utilizing an intermediate alignment motif, the invention is in no way limited to this embodiment. The invention applies to any precise, automatic, reciprocal positioning of two objects carrying alignment motifs, the one forming the reference being constituted by at least one pair of two identical optical gratings illuminated in alternating manner.

The main advantages of the invention can be summarized as follows:
high frequency modulation by electronic and electrooptical means of the signals used for the control (i.e. with low inertia);
precise determination of the rest or zero reference (mechanical zero);
effective filtering of the electrical signals made possible by the high modulating frequency;
no introduction of optical or electrooptical elements into the gaps separating the two alignment motifs (other than that not shown correction lenses and the projection lens in connection with the photo-repetition);
easy adaptation of the device to variable relative positions and dimensions of two alignment motifs without causing significant constraints with regard to the positioning of the reference motif;
easy optimization of the signal $\Delta V_u$ used for the control by simply acting by values $\epsilon$ and $P_C$ (FIG. 7).

What is claimed is:

1. A system for the optical alignment of at least a first motif carried by a moving support with respect to a second motif carried by a fixed supporting forming the reference, the first and second motifs comprising in each case alignment marks of the optical grating type having a constant spacing wherein said first motif comprises at least one optical grating and wherein the alignment marks of said second motif comprise at least first and second identical optical gratings, each constituted by a sequence of lines parallel to a first axis of symmetry and located on either side of said axis, the two identical gratings being spaced from one another by predetermined length and wherein two windows define two portions, respectively, of the first and second optical gratings, the system also comprising optical means with a given magnification serving to project the image of said at least first and second identical optical gratings forming alignment marks of the second motif onto one of said at least one optical grating forming alignment marks of the first motif, the projection correlation producing orders of diffraction whose light intensity detected to optoelectronic means represents the alignment stated reached, and said optical means comprising light energy source producing an alignment beam and a selective switch receiving a control signal of given frequency for alternately illuminating at said frequency in each case one of the windows, the output signal of the optoelectronic means also being generally transmitted to electronic comparison means establishing their level difference between alternations of the control signal.

2. A system according to claim 1, wherein the said predetermined length is given by the equation $d_X = P(n+\epsilon)$ in which P is the common spacing of the first and second gratings, n an integer and $\epsilon$ a fraction of unity.

3. A system according to claim 2, wherein the extension of said gratings in a direction orthogonal to the first axis of symmetry is equal to 1 and the extension of the corresponding grating carried by the moving support is equal to $1_{21}$, so that the equation $1_{21} \geq G|(21+d_X)$ is proved and wherein said corresponding grating is constituted by a sequence of equidistant lines with spacing $P_C$, parallel to a first direction, so that the equation $P_C = |G|P$ is proved, $|G|$ being the absolute value of said determined magnification.

4. A system of according to claim 1, wherein the selective commutating means of the optical means is constituted by an optical modulator located on the path of the alignment beam.

5. A system according to claim 4, wherein the optical modulator is a cell having an acousto-optical effect.

6. A system according to claim 1, wherein the optical modulator is constituted by an electrooptical cell positioned on the path of the alignment beam and so comprising input polarizing means, a crystal plate with electrooptical properties is provided with two control electrodes receiving a square-wave control signals of high frequency and serving to cyclically rotate by $\pi/2$ the polarization of the emergent beam and output analyser means of polarization axis orthogonal to the polarization axis of said polarizer means, a half-wave plate being placed on the input face of the crystal plate having electrooptical properties, the dimensions of said half-wave plate being such that it half-covers the crystal plate, thus creating two half-cells dividing the alignment beam into two equal parts and only one of these two parts is transmitted at each instant, alternating from one period to the next of said control signal to cyclically illuminate the two windows.

7. A system according to claim 6, wherein the crystal plate has a linear electrooptical effect of Pockels effect.

8. A system according to claim 6, wherein the modulator is fixed to a moving element moving also in a direction parallel to the first axis of symmetry making possible the displacement of the windows along said axis and wherein a mirror fixed to said moving element reflects the alignment beam to the selective modulator, the beam being produced by a coherent source of radiant energy in a direction parallel to the first axis of symmetry, optical means being positioned between the modulator and the fixed support to form the image of the laser source in the centre of the input pupil of said optical means with a given magnification.

9. A system according to claim 1, wherein the lines forming the corresponding grating carried by the moving support onto which are alternately projected the image of said first and second grating are periodically interrupted in accordance with a second direction to form a grating having a constant spacing in said direction, the optoelectronic means detecting one of the orders of diffraction differing from the zero order in said second direction and wherein the electronic detection means are synchronized to the frequency of the control signal for affecting said level difference of the output signals of the optoelectronic means from one alternation to the next of the said control signal, the alignment being obtained when the output signals remain constant from one cycle to the next.

10. A system according to claim 1, wherein the alignment marks of the second motif have third and fourth identical optical gratings, each constituted by a sequence of lines parallel to a second axis of symmetry, the sequences being on either direct side of said axis and the gratings being spaced by a predetermined length and wherein also supplementary optical means are provided comprising a coherent source of radiant energy and a selective switch for alternately illuminating the portions of the third and fourth gratings defined by windows.

11. A system according to claim 1, wherein also first and second auxiliary gratings have a constant spacing are arranged on either side of the corresponding grating carried by the moving support and permit a prealignment by removing the uncertainty due to the periodicity of the gratings.

12. A system according to claim 11, wherein said first auxiliary gratings are constituted by a first sequence of equidistant parallel lines with a first constant spacing in accordance with a first direction, whilst the second auxiliary gratings are constituted by a second sequence of equidistant parallel lines of a second constant spacing following a second direction and wherein first and second supplementary optoelectronic means detect one of the orders of diffraction differing from the zero order in accordance with said second direction produced by said first and second auxiliary gratings.

13. A system according to claim 11, wherein the first and second auxiliary gratings are in each case constituted by a sequence of equidistant lines respectively parallel to a third and fourth direction forming a given angle with a first direction, said angle differing from zero and $\pi/2$ and wherein the first and second supplementary optoelectronic means detect one of the orders of diffraction differing from the zero order in accordance with the third and fourth directions produced by the first and second auxiliary gratings.

14. A system according to claim 11, wherein the first and second auxiliary gratings are identical each being constituted by a sequence of equidistant lines parallel to a third direction forming a given angle with the first direction differing from zero and $\pi/2$ and wherein the supplementary optoelectronic means detect one of the orders of diffraction produced by the first and second auxiliary gratings and the third direction, the misalignment direction being determined by comparing relative phases of the control signals and the output signals of the supplementary optoelectronic means.

* * * * *